United States Patent [19]
Mistry et al.

[11] Patent Number: 6,077,726
[45] Date of Patent: Jun. 20, 2000

[54] METHOD AND APPARATUS FOR STRESS RELIEF IN SOLDER BUMP FORMATION ON A SEMICONDUCTOR DEVICE

[75] Inventors: Addi Burjorji Mistry, Austin, Tex.; Vijay Sarihan, Paradise Valley, Ariz.; James H. Kleffner, Leander, Tex.; George F. Carney, Tempe, Ariz.

[73] Assignee: Motorola, Inc., Schaumburg, Ill.

[21] Appl. No.: 09/124,720

[22] Filed: Jul. 30, 1998

[51] Int. Cl.[7] .................................................. H01L 21/44
[52] U.S. Cl. .......................................... 438/108; 438/106
[58] Field of Search ................................... 257/737, 738; 438/106, 108; 361/760

[56] References Cited

U.S. PATENT DOCUMENTS 4,048,438  9/1977  ZImmerman ........................... 174/68.5
5,744,382  4/1998  Kitayama et al. ....................... 438/106

*Primary Examiner*—Carl Whitehead, Jr.
*Assistant Examiner*—Roy Potter
*Attorney, Agent, or Firm*—Daniel D. Hill

[57] ABSTRACT

A semiconductor device (10) includes a bump structure that reduces stress and thus reduces passivation cracking and silicon cratering that can be a failure mode in semiconductor manufacturing. The stress is reduced by forming a polyimide layer (16) over a passivation layer (14). The polyimide layer (16) is extended beyond an edge of the passivation layer (14) over the metal pad (12). A solder bump (22) is composed of a eutectic material and is formed on the metal pad (12) and on the polyimide layer (16). The polyimide layer (16) prevents the solder bump (22) from contacting the passivation layer (14). This is useful for electroless or electroplating technology and may also be useful in other types of bump forming technology such as C4 and E3.

13 Claims, 2 Drawing Sheets

METHOD AND APPARATUS FOR STRESS RELIEF IN SOLDER BUMP FORMATION ON A SEMICONDUCTOR DEVICE

FIELD OF THE INVENTION

This invention relates generally to semiconductor devices, and more particularly, to a method and apparatus for solder bump formation on a semiconductor device.

BACKGROUND OF THE INVENTION

In some semiconductor manufacturing processes, such as "flip chip", bumps are fabricated on pad areas of a semiconductor die in order to interconnect the die to a package. There are various techniques for forming the bumps, such as for example, the C4 (Controlled Collapse Chip Connection) bump process or the E3 (Extended Eutectic Evaporative) bump process. These two processes use a bump made of a solder that is very high in lead content. For example, in the C4 process, approximately 97% of the solder composition is lead. Also, for the E3 process, the solder balls are soft and can be easily deformed. These two evaporative processes can be expensive to fabricate, adding to manufacturing costs.

Electroless and electroplating processes have been developed to form bumps that are made of a harder material and can be fabricated at a much lower cost than either E3 or C4. The bumps are formed of a solder having a composition that makes the bumps relatively harder. For example, a eutectic solder is composed of approximately 63% tin and 37% lead and is harder than the solder used in the E3 or C4 processes.

One problem with the known bump forming technologies, and in particular the electroless and electroplating bump forming processes, is that thermal stress, such as in a solder reflow process step, can create areas of stress which can cause cracks to form. The cracks form in the passivation layer where the solder bump contacts the aluminum pad and the cracks may propagate into the semiconductor die causing failure of the device.

Generally, in the electroless process, a passivation layer is deposited over the metal pad. An opening is formed in the passivation layer to allow a solder joint to be formed on the metal pad. In some embodiments, a polyimide layer may also be formed over the passivation layer. The polyimide layer is pulled back from the edge of the passivation layer. A problem occurs because the solder bump under bump metal (UBM), where it is formed over the passivation layer, does not adhere to the passivation layer. This causes an area of stress at the edge of the passivation layer over the metal pad. As the die is heated and subsequently cooled in the manufacturing process, cracks can develop in the passivation layer, or craters can form in the semiconductor material, at this high stress area, potentially causing complete failure of the semiconductor device. Likewise, in the electroplating process, stress areas can develop at the interfaces of the various materials having different thermal coefficients of expansion. Cracks can develop at these stress areas causing failure of semiconductor device.

Therefore, a need exists for reducing these high stress areas in solder bump formation.

BRIEF DESCRIPTION OF THE DRAWINGS

The present invention is illustrated by way of example and not limited in the accompanying figures, in which like references indicate similar elements, and in which.

DESCRIPTION OF A PREFERRED EMBODIMENT

Generally, the present invention provides a solder bump structure and a method for forming a bump structure that reduces stress and thus reduces passivation cracking and silicon cratering that can be a failure mode in semiconductor device manufacturing. The stress is reduced by forming a polyimide layer over the passivation layer. Instead of pulling back the polyimide layer, the polyimide layer extends beyond the edge of the passivation layer and onto the metal bonding pad itself. A solder bump is then formed on the metal pad and on the polyimide layer. The polyimide layer prevents the solder bump from contacting the passivation layer. This is useful for preventing stress fractures, or cracks, in the passivation layer and subsequent cratering in the semiconductor die which may be formed when using an electroless or electroplating technology. The present method and bump structure may also be useful in other types of bump forming technology such as C4 and E3.

Figure 1:
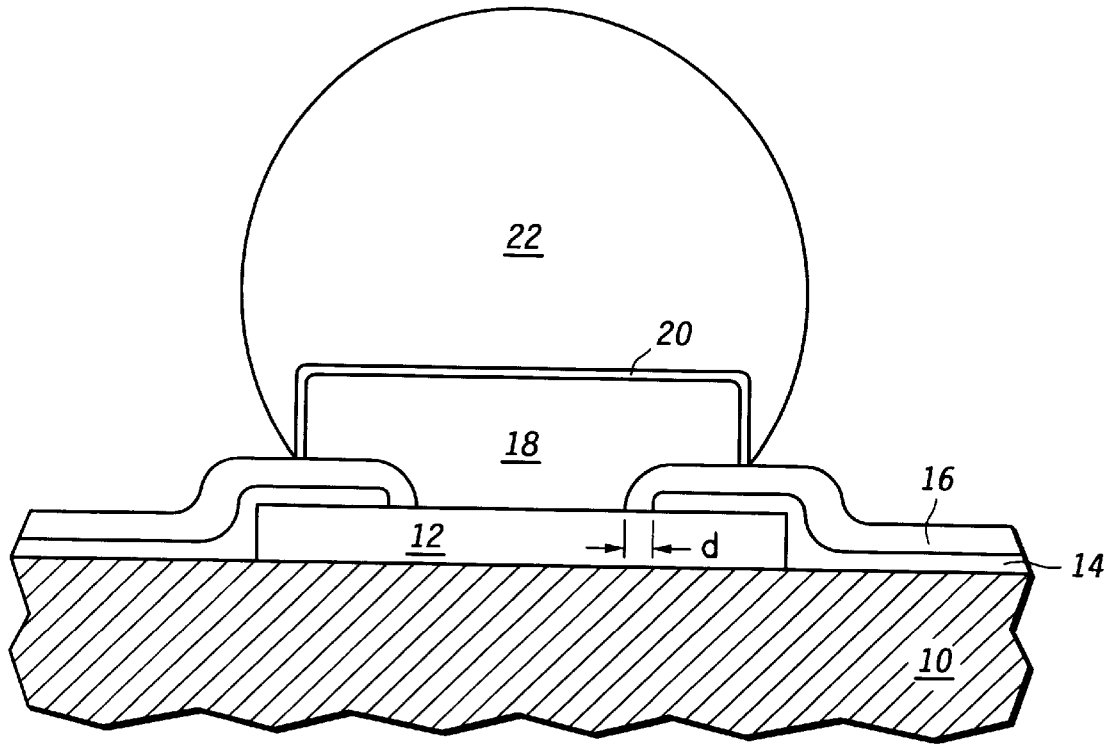
FIG. 1 illustrates a cross-sectional view of an electroless solder bump on a semiconductor die in accordance with one embodiment of the present invention.

FIG. 1 illustrates a cross-sectional view of an electroless solder bump formed on a semiconductor die 10 in accordance with the present invention. In FIG. 1, a metal pad 12 is formed on a semiconductor material 10. Metal pad 12 may be formed from a conductive metal such as aluminum or copper, and serves as a terminal for external connections of the semiconductor device. Semiconductor material 10 may be composed of silicon or some other semiconductive material such as gallium arsenide. Electronic circuits are fabricated on the surface semiconductor material 10 using a conventional semiconductor manufacturing process. A passivation layer 14 is formed over semiconductor material 10 and metal pad 12. An opening is provided over metal pad 12 in the area where the solder bump is to be formed. Passivation layer 14 may be PSG (phosphorus silicate glass) and silicon oxy-nitride or silicon nitride, and is generally formed to protect the electronic circuitry during the fabrication process.

A polyimide layer 16 is then formed over passivation layer 14. Note that, in a conventional process, the polyimide layer 16 would be pulled back from the edge of the passivation layer 14 in the area where the solder bump is formed. The metal layers for forming the solder bump are formed on the passivation layer 14 and on the metal pad 12. In accordance with the present invention, the polyimide layer 16 is not pulled back to the edge of the passivation layer 14, but entirely covers passivation layer 14. The polyimide layer 14 is spun-on to a thickness of about 3–8 microns. In addition to completely covering passivation layer 14, polyimide layer 16 extends onto metal pad 12 by a predetermined distance labeled "d" in FIG. 1 in a direction parallel to a plane defined by metal pad 12 and towards a center region of metal pad 12. By making distance "d" as long as possible, the stress created at the edge of passivation layer 14 is relieved, thus reducing the possibility of stress cracks forming in passivation layer 14, metal layer 12, and reducing the possibly of craters forming in semiconductor material 10. In the illustrated embodiment, distance "d" is in a range of between about 3 to 12 microns, and preferably about 8 microns.

Still referring to FIG. 1, an under bump metal (UBM) layer 18 is formed over the opening in polyimide layer 16 and covering polyimide layer 16 and metal pad 12. In the illustrated embodiment, UBM layer 18 is formed of nickel. In other embodiments, UBM layer 18 may be formed of any other type of metal. A thin gold layer 20 is formed over UBM layer 18 using an electroless plating process. Solder bump 22 is then formed over gold layer 20 using a stencil and solder paste. In the illustrated embodiment, solder bump 22 is a eutectic solder bump composed of approximately 63% tin and 37% lead. The solder paste is reflowed at a temperature of approximately 200° C., forming solder bump 22.

By extending polyimide layer 16 over passivation layer 14, the passivation edge, or boundary area, is protected from chemical ingression, preventing chemicals and other contaminants from causing corrosion and thus improving reliability. Also, increasing the distance between solder bump 22 and passivation layer 14 by the distance "d" reduces stress at the edge of passivation layer 14, thus reducing the possibility of cracks forming in metal pad 12 and semiconductor material 10. As discussed above, in the illustrated embodiment, distance "d" can be in the range of 3–12 microns. However, in other embodiments, distance "d" may be different than the 3–12 micron range as long as the passivation layer 14 is completely covered and there is a separation between solder bump 22 and passivation layer 14 to provide the stress relief.

Figure 2:
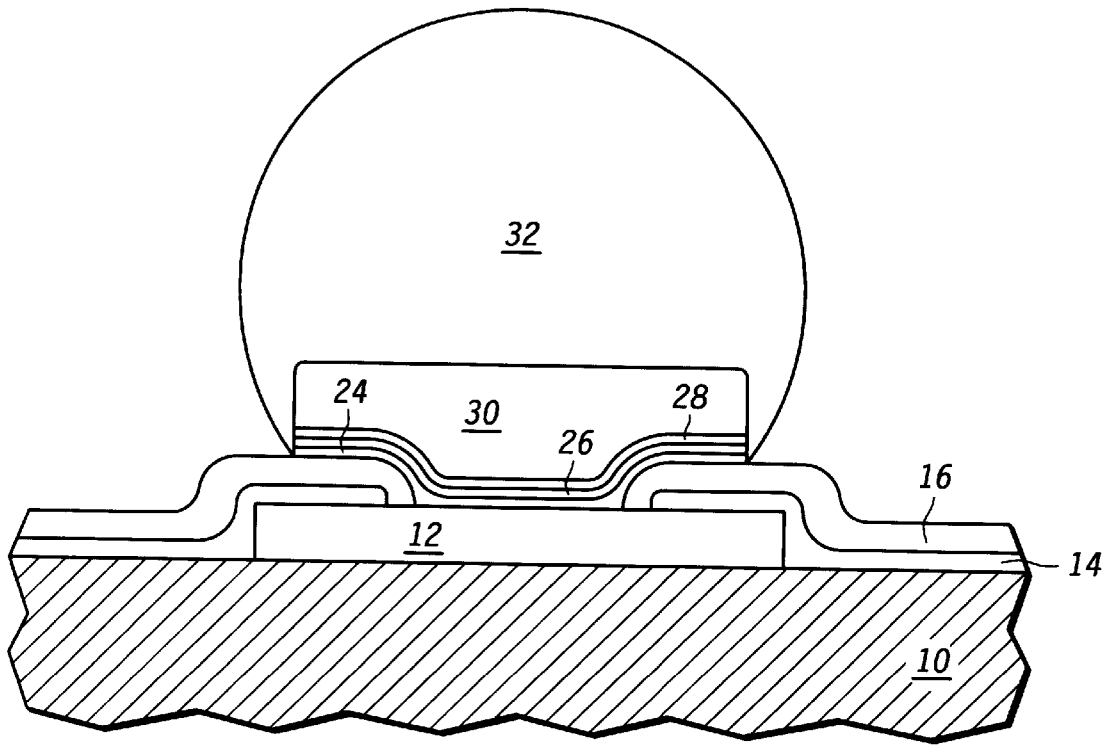
FIG. 2 illustrates a cross-sectional view of an electroplated solder bump on a semiconductor die in accordance with another embodiment of the present invention.

FIG. 2 illustrates a cross-sectional view of an electroplated solder bump 32 on a semiconductor substrate 10 in accordance with another embodiment of the present invention. In FIG. 2, semiconductor substrate 10, metal pad 12, passivation layer 14 and polyimide layer 16 are formed in the same way as described in FIG. 1 above. Metal layers 24 and 26 are sputter deposited onto metal pad 12 and are formed of a titanium tungsten nitride and titanium tungsten, respectively. Metal layer 28 is sputter deposited over metal layers 24 and 26. Metal layer 28 is composed of copper in the illustrated embodiment. Metal stud 30 is composed of electroplated copper over metal layer 28. A eutectic solder bump 32 is then electroplated over stud 30. Eutectic solder bump 32 is composed of approximately 63% tin and 37% lead.

As discussed above in FIG. 1 polyimide layer 16 isolates passivation layer 14 from the metal layers forming the eutectic bump. By isolating the metal stud 30 from the passivation layer 14, residual stress in the structure is relieved, preventing stress fractures from forming during the reflow process.

Figure 3:
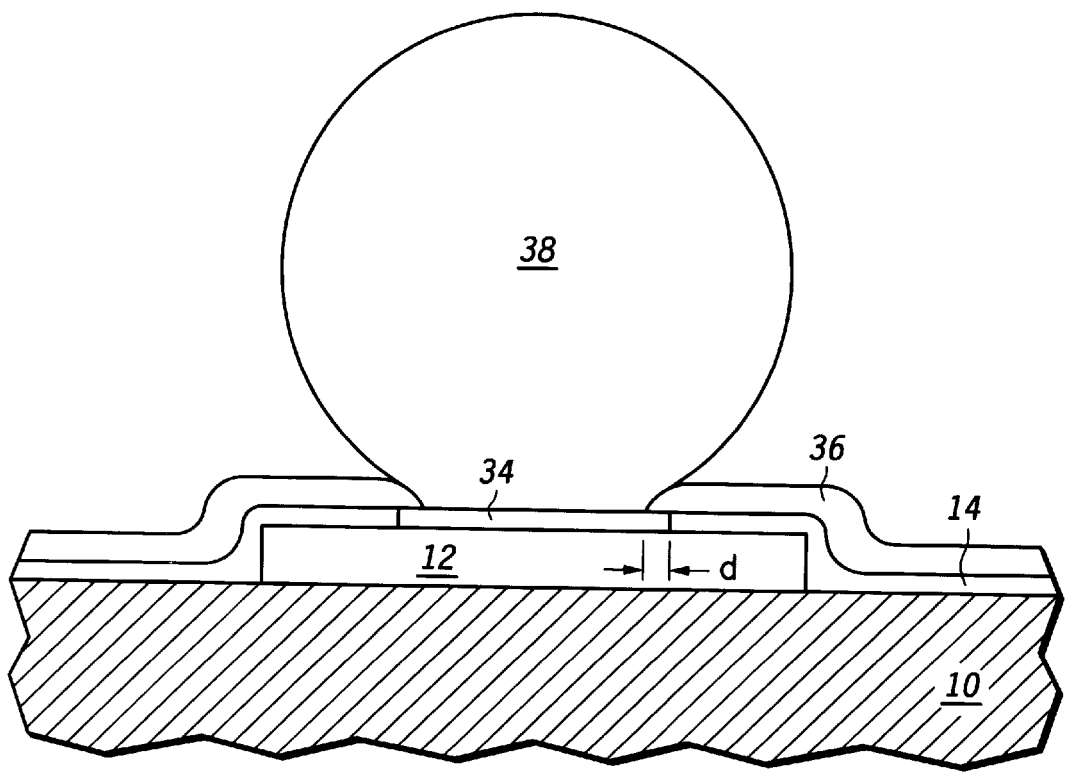
FIG. 3 illustrates a cross-sectional view of a solder bump in accordance with another embodiment of the present invention.

FIG. 3 illustrates a cross-sectional view of a solder bump formed in accordance with another embodiment of the present invention. In FIG. 3, a metal pad 12 is formed on a semiconductor material 10. Metal pad 12 may be formed from a conductive metal such as aluminum or copper. Semiconductor material 10 may be composed of silicon or some other semiconductive material such as gallium arsenide. Electronic circuits are fabricated on the surface semiconductor material 10 using a conventional semiconductor manufacturing process. A passivation layer 14 is formed over the semiconductor material 10 and metal pad 12. An opening is provided over metal pad 12 in the area where the solder bump is to be formed. Passivation layer 14 may be PSG (phosphorus silicate glass) and silicon oxy-nitride or silicon nitride, and is formed to protect the electronic circuitry during the fabrication process.

The solder bump illustrated in FIG. 3 is different than the solder bump illustrated in FIG. 2 because UBM layer 34 does not overlap passivation layer 14. The non-overlap of UBM layer 34 and passivation layer 14 can be achieved by using an additional photomasking stage to prevent the growth of UBM layer 34 over passivation layer 14. This limits the side growth of UBM layer 34 and is controlled by defining the photomask dimensions. In FIG. 3, UBM layer 34 is shown contacting passivation layer 14. However, there may a gap between UBM layer 34 and passivation layer 14 that is filled by the deposition of polyimide layer 36.

The photomask used to limit the side growth of UBM layer 34 is removed and polyimide layer 36 is spun-on over passivation layer 14. Polyimide layer extends over UBM layer 34 by a distance labeled "d" in FIG. 3. The distance "d" is in the range of 3–12 microns in the illustrated embodiment. However, in other embodiments the distance "d" may be less than or greater than 3–12 microns. Solder bump 38 is then either stencil printed, electroplated, or evaporated onto the exposed area of UBM layer 34 using conventional techniques. By extending polyimide layer 36 over UBM layer 34, the metal layers are separated from passivation layer 14, thus preventing any cracks when may develop from propagating in passivation layer 14 and also preventing cratering of semiconductor material 10.

Note that, even though the embodiments of the present invention have been discussed in connection with the electroless and electroplating bump forming processes, one skilled in the area of semiconductor fabrication will recognize that the present invention can be extended to other bump forming processes, such as for example, the C4, E3, or any other bump forming technologies that benefit from stress relief.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method for forming a solder bump structure on a metal bonding pad of a semiconductor device, the method comprising the steps of:

forming a passivation layer to isolate the metal bonding pad of the semiconductor device, the passivation layer overlapping an edge of the metal bonding pad;

forming a polyimide layer covering the passivation layer and extending over the passivation layer towards a center region of the metal bonding pad;

forming an under bump metal layer over the center region of the metal bonding pad; and forming a solder bump on the under bump metal layer.

2. The method as in claim 1, wherein in the step of forming the polyimide layer, the polyimide layer is formed so that it extends onto the metal bonding pad.

3. The method as in claim 1, wherein in the step of forming the polyimide layer, forming the polyimide layer so that the polyimide layer completely covers the passivation layer.

4. The method as in claim 1, wherein in the step of forming the polyimide layer, the polyimide layer is formed so that the polyimide layer extends into a direction parallel to a plane defined by the metal bonding pad.

5. The method as in claim 1, wherein in the step of forming the polyimide layer, the polyimide layer is formed so that the polyimide layer extends beyond an edge of the passivation layer in the range of about 3 to 12 microns beyond the edge of the passivation layer.

6. The method as in claim 5, wherein the polyimide layer contacts the metal bonding pad.

7. The method as in claim 5, wherein the under bump metal layer extends over the polyimide layer.

8. The method as in claim 5, wherein the distance that the polyimide layer extends over the metal bonding pad beyond the edge of the passivation layer is about 8 microns.

9. The method as in claim 1, wherein the step of forming the solder bump comprises forming an eutectic solder bump.

10. The method as in claim 9, wherein the eutectic solder bump is formed using a stencil and solder paste.

11. The method as in claim 1, wherein the under bump metal layer is formed using an electroless plating process.

12. The method as in claim 1, wherein the under bump metal is formed using an electroplating process.

13. The method as in claim 1, wherein in the step of forming a solder bump a sputtering process is used for the formation of the under bump metal layer.

\* \* \* \* \*